(12) United States Patent
Tang et al.

(10) Patent No.: US 11,933,828 B2
(45) Date of Patent: Mar. 19, 2024

(54) MEASUREMENT METHOD AND DEVICE

(71) Applicant: Huawei Technologies Co., Ltd., Shenzhen (CN)

(72) Inventors: Yi Tang, Chengdu (CN); Zhiwei Zhang, Shanghai (CN); Feng Li, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 639 days.

(21) Appl. No.: 17/118,221

(22) Filed: Dec. 10, 2020

(65) Prior Publication Data

US 2021/0088569 A1    Mar. 25, 2021

Related U.S. Application Data

(63) Continuation of application No. PCT/CN2019/094283, filed on Jul. 1, 2019.

(30) Foreign Application Priority Data

Jun. 30, 2018  (CN) .......................... 201810702881.X

(51) Int. Cl.
  *G01R 29/08* (2006.01)
  *G01R 29/10* (2006.01)
  (Continued)

(52) U.S. Cl.
  CPC ......... *G01R 29/0892* (2013.01); *G01R 29/10* (2013.01); *H01Q 3/28* (2013.01); *H01Q 3/34* (2013.01)

(58) Field of Classification Search
  CPC ...... G01R 29/0892; G01R 29/10; H01Q 3/28; H01Q 3/34
  See application file for complete search history.

(56) References Cited

U.S. PATENT DOCUMENTS 5,477,229 A  *  12/1995  Caille ................... H01Q 3/267
                                                342/174
5,485,158 A     1/1996  Mailloux et al.
(Continued)

FOREIGN PATENT DOCUMENTS

CN          1537367 A      10/2004
CN        101483273 A       7/2009
(Continued)

OTHER PUBLICATIONS

Amoozegar, Farid, et al. "Analysis of errors for uplink array of 34-m antennas for deep space applications." 2005 IEEE Aerospace Conference. IEEE, 2005. (Year: 2005).*
(Continued)

*Primary Examiner* — Raymond L Nimox
(74) *Attorney, Agent, or Firm* — Conley Rose, P.C.

(57) ABSTRACT

A measurement method for a device includes, for each antenna group other than a target antenna group in an antenna array, determining compensation values of the antenna group based on characteristic parameters of the antenna group and characteristic parameters of the target antenna group, and adjusting, based on the compensation values of the antenna group, an electromagnetic wave transmitted by each antenna unit in the antenna group such that electromagnetic waves transmitted by all antenna units in the antenna array have a same phase or amplitude when the electromagnetic waves arrive at a measurement probe of a second device, where the electromagnetic wave is used to measure an over-the-air beam parameter of the first device, and a distance between the first device and the measurement probe is less than a far-field boundary distance.

20 Claims, 6 Drawing Sheets

(51) Int. Cl.
*H01Q 3/28* (2006.01)
*H01Q 3/34* (2006.01)

(56) References Cited

U.S. PATENT DOCUMENTS

| | | | | |
|---|---|---|---|---|
| 5,721,554 | A | * 2/1998 | Hall | G01S 7/4052 |
| | | | | 342/170 |
| 2004/0166808 | A1 | 8/2004 | Hasegawa et al. | |
| 2011/0134001 | A1* | 6/2011 | Sakata | G01R 29/105 |
| | | | | 343/703 |
| 2017/0242061 | A1 | 8/2017 | Gottl et al. | |
| 2017/0336454 | A1* | 11/2017 | Hinotani | G01R 29/10 |
| 2018/0062260 | A1* | 3/2018 | Khalil | H04B 5/0043 |
| 2018/0062971 | A1* | 3/2018 | Kyosti | H04L 43/50 |
| 2018/0102859 | A1 | 4/2018 | Rowell et al. | |
| 2018/0342802 | A1 | 11/2018 | Lyu | |
| 2019/0235003 | A1* | 8/2019 | Paulsen | G01R 29/10 |
| 2021/0088569 | A1 | 3/2021 | Tang et al. | |

FOREIGN PATENT DOCUMENTS

| | | | |
|---|---|---|---|
| CN | 104283624 | A | 1/2015 |
| CN | 105842670 | A | 8/2016 |
| CN | 106291129 | A * | 1/2017 |
| CN | 106291129 | A | 1/2017 |
| CN | 106324573 | A | 1/2017 |
| CN | 106443209 | A | 2/2017 |
| CN | 106850086 | A | 6/2017 |
| CN | 107132427 | A | 9/2017 |
| CN | 107390039 | A | 11/2017 |
| CN | 107800495 | A | 3/2018 |
| CN | 108963459 | A | 12/2018 |
| EP | 3207383 | B1 | 7/2020 |
| IN | 106788791 | A | 5/2017 |
| JP | H1164487 | A | 3/1999 |
| JP | 2014163716 | A | 9/2014 |
| JP | 2014163716 | A * | 9/2014 |
| WO | 2017132956 | A1 | 8/2017 |

OTHER PUBLICATIONS

Johnson, Richard C., H. Allen Ecker, and J. Searcy Hollis. "Determination of far-field antenna patterns from near-field measurements." Proceedings of the IEEE 61.12 (1973): 1668-1694. (Year: 1973).*

Medina, Rafael H., et al. "Calibration and validation of the CASA phased array antenna." 2012 42nd European Microwave Conference. IEEE, 2012. (Year: 2012).*

3GPP TS 38.104 V1.0.0 (Dec. 2017), "3rd Generation Partnership Project; Technical Specification Group Radio Access Network; NR; Base Station (BS) radio transmission and reception (Release 15)," 123 pages.

* cited by examiner

MEASUREMENT METHOD AND DEVICE

CROSS-REFERENCE TO RELATED APPLICATIONS

This application is a continuation application of International Patent Application No. PCT/CN2019/094283, filed on Jul. 1, 2019, which claims priority to Chinese Patent Application No. 201810702881.X, filed on Jun. 30, 2018. The disclosures of the aforementioned applications are hereby incorporated by reference in their entireties.

TECHNICAL FIELD

Embodiments of this application relate to the communications field, and in particular, to a measurement method and a device.

BACKGROUND

A massive multiple-input multiple-output (MIMO) technology based on a phased array antenna is widely used in a fifth generation (5G) communications system. A network device and a terminal device each may be an antenna array including a plurality of antenna units that are independently controllable in phase (or delay) and that are arranged based on a specific spatial layout.

Usually, an over-the-air (OTA) beam indicator of a network device or a terminal device may be measured using an over-the-air measurement technology. An OTA measurement system is deployed in a darkroom to obtain the over-the-air beam indicator of the network device or the terminal device. The OTA measurement system includes a measurement probe and a measured device (the network device or the terminal device). To obtain a relatively accurate measurement result, an over-the-air beam indicator of the device is usually measured in a far field, that is, a distance between the measurement probe and the measured device is relatively long. Consequently, the OTA measurement system occupies relatively large space, and is not suitable for large-scale deployment and use in production.

To reduce the space occupied by the OTA measurement system, a spherical wave emitted by the measured device may be converted into a plane wave through a collimating component within a short distance, to meet a far-field measurement requirement. However, the collimating component needs to be processed with high precision, leading to complex mounting and maintenance and high costs.

SUMMARY

Embodiments of this application provide a measurement method and a device, to reduce measurement costs while achieving an equivalent far-field measurement effect within a short distance using a small-sized measurement system, helping deploy the measurement system widely.

To achieve the foregoing objective, the following technical solutions are used in the embodiments of this application.

According to a first aspect, a measurement method is disclosed, where the method is applied to an over-the-air measurement system, the over-the-air measurement system includes a second device and a first device, the first device includes an antenna array, the antenna array includes at least one antenna group, and the second device includes a measurement probe, where a distance between the first device and the measurement probe is less than a far-field boundary distance. The method includes, for each antenna group other than a target antenna group in the antenna array, determining compensation values of the antenna group based on characteristic parameters of the antenna group and characteristic parameters of the target antenna group, where the compensation values include a phase compensation value and an amplitude compensation value, the characteristic parameters include a first characteristic parameter and a second characteristic parameter, the first characteristic parameter is used to determine a phase compensation value, and the second characteristic parameter is used to determine an amplitude compensation value, and further, adjusting, based on the compensation values of the antenna group, an electromagnetic wave transmitted by each antenna unit in the antenna group such that electromagnetic waves transmitted by all antenna units in the antenna array have a same phase and/or amplitude when the electromagnetic waves arrive at the measurement probe, and are coherently superposed. The second device may measure an electromagnetic wave transmitted by the first device, to obtain an over-the-air beam parameter of the first device.

In this embodiment of the present disclosure, electromagnetic waves transmitted by all antennas of the first device have aligned amplitudes and phases on the measurement probe, and are coherently superposed, thereby achieving equivalent far-field alignment and superposition of the amplitudes and the phases of the electromagnetic waves transmitted by all the antennas. That is, in this embodiment of the present disclosure, measurement costs can be reduced while an equivalent far-field measurement effect can be achieved within a short distance using a small-sized measurement system, helping deploy the measurement system widely. In addition, in an equivalent far field, electromagnetic waves transmitted by a to-be-measured device are coherently superposed at a measurement probe, and amplitudes of the electromagnetic waves are amplified such that a more accurate measurement result can be obtained. It can be learned that the method provided in this embodiment of the present disclosure can achieve a far-field measurement effect in a medium or near field, and obtain a highly accurate measurement result.

With reference to the first aspect, in a first possible implementation of the first aspect, the determining compensation values of the antenna group based on characteristic parameters of the antenna group and characteristic parameters of the target antenna group includes using a distance from a center point of the antenna group to the measurement probe as the first characteristic parameter of the antenna group, calculating a distance difference between the first characteristic parameter of the antenna group and the first characteristic parameter of the target antenna group in the antenna array, and calculating the phase compensation value of the antenna group based on the distance difference of the antenna group, and using an azimuth and a pitch angle between a normal line of the measurement probe and a connection line between the center point of the antenna group and a center point of the measurement probe as the second characteristic parameter of the antenna group, obtaining a gain decrement of the antenna group based on the azimuth corresponding to the antenna group, obtaining a gain decrement of the measurement probe based on the pitch angle corresponding to the antenna group, and using a sum of the gain decrement of the antenna group and the gain decrement of the measurement probe as the amplitude compensation value of the antenna group.

In this embodiment of the present disclosure, the phase compensation value of the antenna group may be calculated based on the distance between the antenna group and the measurement probe, to make phase compensation for an electromagnetic wave transmitted by the antenna group, and the amplitude compensation value of the antenna group may be calculated based on an angle between the antenna group and the measurement probe, to make amplitude compensation for the electromagnetic wave transmitted by the antenna group. In this way, electromagnetic waves transmitted by the antenna groups are coherently superposed when arriving at the measurement probe, and beam strength is increased. Therefore, a more accurate measurement result can be obtained when a beam is measured.

With reference to the first possible implementation of the first aspect, in a second possible implementation of the first aspect, the phase compensation value $\Delta\phi$ meets $\Delta\phi=\Delta d/(\lambda*360)$, where $\Delta d$ is the distance difference of the antenna group, and $\lambda$ is a wavelength of an electromagnetic wave transmitted by the antenna array.

In this embodiment of the present disclosure, a required compensation phase may be accurately calculated according to the foregoing calculation formula, to provide a basis for subsequent phase adjustment, and ensure, to some extent, that electromagnetic waves transmitted by the first device are coherently superposed when arriving at the measurement probe.

With reference to the first aspect, in a third possible implementation of the first aspect, that the first device determines, based on the characteristic parameters of each antenna group in the antenna array, the compensation values corresponding to each antenna group in the antenna array includes the determining compensation values of the antenna group based on characteristic parameters of the antenna group and characteristic parameters of the target antenna group includes first, transmitting an electromagnetic wave using each antenna group in the antenna array, and then, obtaining an amplitude and a phase, of the electromagnetic wave transmitted by each antenna group, that exist when the electromagnetic wave transmitted by each antenna group arrives at the measurement probe, calculating a phase difference between the phase, of the electromagnetic wave transmitted by the antenna group, that exists when the electromagnetic wave transmitted by the antenna group arrives at the measurement probe and the phase, of the electromagnetic wave transmitted by the target antenna group, that exists when the electromagnetic wave transmitted by the target antenna group arrives at the measurement probe, and using the phase difference as the phase compensation value of the antenna group, where the phase, of the electromagnetic wave transmitted by the antenna group, that exists when the electromagnetic wave transmitted by the antenna group arrives at the measurement probe is the first characteristic parameter of the antenna group, and the phase, of the electromagnetic wave transmitted by the target antenna group, that exists when the electromagnetic wave transmitted by the target antenna group arrives at the measurement probe is the first characteristic parameter of the target antenna group, and calculating an amplitude difference between the amplitude, of the electromagnetic wave transmitted by the antenna group, that exists when the electromagnetic wave transmitted by the antenna group arrives at the measurement probe and the amplitude, of the electromagnetic wave transmitted by the target antenna group, that exists when the electromagnetic wave transmitted by the target antenna group arrives at the measurement probe, and using the amplitude difference as the amplitude compensation value of the antenna group, where the amplitude, of the electromagnetic wave transmitted by the antenna group, that exists when the electromagnetic wave transmitted by the antenna group arrives at the measurement probe is the second characteristic parameter of the antenna group, and the amplitude, of the electromagnetic wave transmitted by the target antenna group, that exists when the electromagnetic wave transmitted by the target antenna group arrives at the measurement probe is the second characteristic parameter of the target antenna group.

In this embodiment of the present disclosure, amplitude and phase values that are of the antenna groups and that are obtained when electromagnetic waves transmitted by the antenna groups arrive at the measurement probe may also be measured one by one, to obtain an amplitude difference and a phase difference of each antenna group. A specified amplitude compensation value needs to be used to compensate for the amplitude difference obtained herein, and a specified phase compensation value needs to be used to compensate for the phase difference obtained herein, to ensure that amplitudes and phases of signals of the antenna groups are aligned at the measurement probe.

With reference to any one of the first aspect or the first to the third possible implementations of the first aspect, in a fourth possible implementation of the first aspect, the method further includes adjusting, based on the compensation values corresponding to the antenna group, an electromagnetic wave received by each antenna unit in the antenna group such that electromagnetic waves received by all the antenna units in the antenna array have a same phase and/or amplitude, and measuring the over-the-air beam parameter of the first device based on a signal received by each antenna unit in the antenna array.

In this embodiment of the present disclosure, an electromagnetic wave transmitted by the measurement probe may be further measured, to obtain an over-the-air beam parameter of the second device.

With reference to any one of the first aspect or the first to the fourth possible implementations of the first aspect, in a fifth possible implementation of the first aspect, the over-the-air beam parameter in this embodiment of the present disclosure includes at least one of an effective isotropically radiated power (EIRP), an error vector magnitude (EVM), an adjacent channel leakage ratio (ACLR), a frequency error, and effective isotropic sensitivity (EIS).

According to a second aspect, a device is disclosed, where the device is a first device, the first device belongs to an over-the-air measurement system, the over-the-air measurement system further includes a second device, the first device includes an antenna array, the antenna array includes at least one antenna group, the second device includes a measurement probe, a distance between the first device and the measurement probe is less than a far-field boundary distance, and the first device includes a processing module configured to, for each antenna group other than a target antenna group in the antenna array, obtain characteristic parameters of the antenna group and characteristic parameters of the target antenna group, and determine compensation values of the antenna group based on the characteristic parameters of the antenna group and the characteristic parameters of the target antenna group, where the compensation values include a phase compensation value and an amplitude compensation value, the characteristic parameters include a first characteristic parameter and a second characteristic parameter, the first characteristic parameter is used to determine a phase compensation value, and the second characteristic parameter is used to determine an amplitude compensation value, where the processing module is further configured to adjust, based on the compensation values of the antenna group, an electromagnetic wave transmitted by each antenna unit in the antenna group such that electromagnetic waves transmitted by all antenna units in the antenna array have a same phase and/or amplitude when the electromagnetic waves arrive at the measurement probe, where the electromagnetic wave is used to measure an over-the-air beam parameter of the first device.

In this embodiment of the present disclosure, electromagnetic waves transmitted by all antennas of the first device have aligned amplitudes and phases on the measurement probe, and are coherently superposed, thereby achieving equivalent far-field alignment and superposition of the amplitudes and the phases of the electromagnetic waves transmitted by all the antennas. That is, in this embodiment of the present disclosure, measurement costs can be reduced while an equivalent far-field measurement effect can be achieved within a short distance using a small-sized measurement system, helping deploy the measurement system widely. In addition, in an equivalent far field, electromagnetic waves transmitted by a measured device are coherently superposed at a measurement probe, and amplitudes of the electromagnetic waves are amplified such that a more accurate measurement result can be obtained. It can be learned that the method provided in this embodiment of the present disclosure can achieve a far-field measurement effect in a medium or near field, and obtain a highly accurate measurement result.

With reference to the second aspect, in a first possible implementation of the second aspect, the processing module is configured to use a distance from a center point of the antenna group to the measurement probe as the first characteristic parameter of the antenna group, calculate a distance difference between the first characteristic parameter of the antenna group and the first characteristic parameter of the target antenna group in the antenna array, and calculate the phase compensation value of the antenna group based on the distance difference of the antenna group, and use an azimuth and a pitch angle between a normal line of the measurement probe and a connection line between the center point of the antenna group and a center point of the measurement probe as the second characteristic parameter of the antenna group, obtain a gain decrement of the antenna group based on the azimuth corresponding to the antenna group, obtain a gain decrement of the measurement probe based on the pitch angle corresponding to the antenna group, and use a sum of the gain decrement of the antenna group and the gain decrement of the measurement probe as the amplitude compensation value of the antenna group.

With reference to the first possible implementation of the second aspect, in a second possible implementation of the second aspect, the phase compensation value $\Delta\phi$ meets $\Delta\phi=\Delta d/(\lambda*360)$, where $\Delta d$ is the distance difference of the antenna group, and $\lambda$ is a wavelength of an electromagnetic wave transmitted by the antenna array.

With reference to the second aspect, in a third possible implementation of the second aspect, the processing module is configured to obtain an amplitude and a phase, of an electromagnetic wave transmitted by each antenna group in the antenna array, that exist when the electromagnetic wave transmitted by each antenna group arrives at the measurement probe, calculate a phase difference between the phase, of the electromagnetic wave transmitted by the antenna group, that exists when the electromagnetic wave transmitted by the antenna group arrives at the measurement probe and the phase, of the electromagnetic wave transmitted by the target antenna group, that exists when the electromagnetic wave transmitted by the target antenna group arrives at the measurement probe, and use the phase difference as the phase compensation value of the antenna group, where the phase, of the electromagnetic wave transmitted by the antenna group, that exists when the electromagnetic wave transmitted by the antenna group arrives at the measurement probe is the first characteristic parameter of the antenna group, and the phase, of the electromagnetic wave transmitted by the target antenna group, that exists when the electromagnetic wave transmitted by the target antenna group arrives at the measurement probe is the first characteristic parameter of the target antenna group, and calculate an amplitude difference between the amplitude, of the electromagnetic wave transmitted by the antenna group, that exists when the electromagnetic wave transmitted by the antenna group arrives at the measurement probe and the amplitude, of the electromagnetic wave transmitted by the target antenna group, that exists when the electromagnetic wave transmitted by the target antenna group arrives at the measurement probe, and use the amplitude difference as the amplitude compensation value of the antenna group, where the amplitude, of the electromagnetic wave transmitted by the antenna group, that exists when the electromagnetic wave transmitted by the antenna group arrives at the measurement probe is the second characteristic parameter of the antenna group, and the amplitude, of the electromagnetic wave transmitted by the target antenna group, that exists when the electromagnetic wave transmitted by the target antenna group arrives at the measurement probe is the second characteristic parameter of the target antenna group.

With reference to any one of the second aspect or the first to the third possible implementations of the second aspect, in a fourth possible implementation of the second aspect, the processing module is further configured to adjust, based on the compensation values corresponding to the antenna group, an electromagnetic wave received by each antenna unit in the antenna group such that electromagnetic waves received by all the antenna units in the antenna array have a same phase and/or amplitude, and measure an over-the-air beam parameter of the first device based on a signal received by each antenna unit in the antenna array.

With reference to any one of the second aspect or the first to the fourth possible implementations of the second aspect, in a fifth possible implementation of the second aspect, the over-the-air beam parameter includes at least one of an EIRP, an EVM, an ACLR, a frequency error, and EIS.

DESCRIPTION OF EMBODIMENTS

Figure 1:
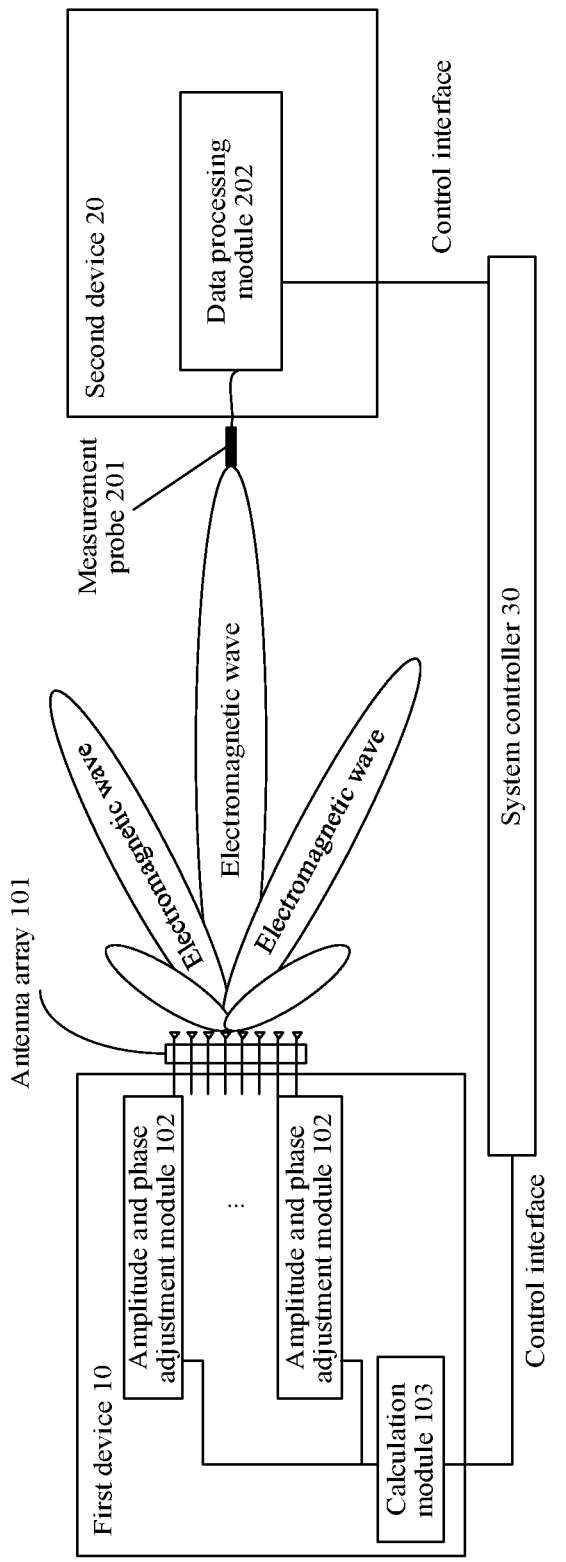
FIG. 1 is an architectural diagram of an over-the-air measurement system according to an embodiment of this application.

An embodiment of the present disclosure provides an over-the-air measurement system that can measure, within a medium or near field distance, an over-the-air beam parameter of an electromagnetic wave transmitted by a device. Referring to FIG. 1, the over-the-air measurement system includes a first device 10, a second device 20, and a system controller 30. The second device 20 may measure, at an over-the-air, an electromagnetic wave transmitted by the first device 10, to obtain an over-the-air beam parameter of the electromagnetic wave transmitted by the first device 10. The system controller 30 may control the first device 10 and the second device 20, to complete an entire measurement procedure.

A distance between the first device 10 and the second device 20 is less than a far-field boundary distance. The far-field boundary distance is equal to $2d^2/\lambda$, where d is an antenna aperture of the first device, and $\lambda$ is a wavelength of the electromagnetic wave transmitted by the first device. Referring to FIG. 1, the first device 10 is an active antenna product, and includes an antenna array 101, an amplitude and phase adjustment module 102, and a calculation module 103. The amplitude and phase adjustment module 102 and the calculation module 103 may be collectively referred to as a processing module. The antenna array includes antenna units arranged in a matrix form, and the antenna units may be phased array antennas. In addition, one or more antenna units constitute one antenna group. The calculation module 103 is connected to all amplitude and phase adjustment modules 102. One amplitude and phase adjustment module 102 is connected to one antenna group, and is configured to adjust an amplitude and a phase of an electromagnetic wave transmitted by the antenna group.

In a specific implementation, the calculation module 103 is configured to calculate an amplitude compensation value and/or a phase compensation value of each antenna group, and then send the amplitude compensation value and/or the phase compensation value of the antenna group to the amplitude and phase adjustment module 102 connected to the antenna group. The amplitude and phase adjustment module 102 separately adjusts amplitudes and phases of electromagnetic waves transmitted by a plurality of antennas in the antenna group connected to the amplitude and phase adjustment module 102, and performs superposition after the adjustment, to obtain a final transmitted signal. In some embodiments, one antenna group may include two antennas. In addition, each amplitude and phase adjustment module 102 is connected to the system controller 103 using a control interface.

Referring to FIG. 1, the second device 20 includes a measurement probe 201 and a data processing module 202. The measurement probe 201 is configured to receive the electromagnetic wave transmitted by the first device. The data processing module 202 is configured to obtain, based on the received electromagnetic wave, an over-the-air beam parameter, for example, an EIRP, an EVM, an ACLR, a frequency error, EIS, or the like. Certainly, the over-the-air beam parameter described in this embodiment of the present disclosure is not limited to the foregoing parameters, and may be another parameter obtained using this embodiment of the present disclosure.

In a specific implementation, the calculation module 103 calculates an amplitude and a phase of each antenna group, and the amplitude and phase adjustment module 102 may include an analog attenuator and a phase shifter. The amplitude and phase adjustment module 102 adjusts, in an analog domain using the attenuator and the phase shifter, an amplitude and a phase of the transmitted electromagnetic wave. Certainly, the amplitude and phase adjustment module 102 may alternatively directly adjust an amplitude and a phase in a digital manner. That is, when transmitting an electromagnetic wave, the first device 20 performs amplitude and phase adjustment in a digital domain, and then the electromagnetic wave enters a digital-to-analog converter (DAC) and changes into an analog signal. During reception, after an analog-to-digital conversion (ADC), amplitude and phase adjustment is performed in the digital domain, and then signals are superposed. It should be noted that the amplitude and phase adjustment module 102 may alternatively implement amplitude and phase adjustment in a manner mixing analog and digital. This is not limited in this embodiment of the present disclosure.

The data processing unit 202 may be a measurement instrument, such as a spectrum analyzer, a power meter, a signal generator, or a radio communication tester. It should be noted that, if an antenna of the first device is an active antenna, the amplitude and phase adjustment module 102 may be built in the first device. If an antenna of the first device is a passive antenna, the amplitude and phase adjustment module 102 needs to be disposed outside the first device.

An embodiment of the present disclosure provides a measurement method, applied to the over-the-air measurement system shown in FIG. 1, and capable of measuring, over the air, an electromagnetic wave transmitted by a device within a medium or near field measurement distance. The measured device (that is, the first device in the embodiments of the present disclosure) may adjust an amplitude or a phase of an electromagnetic wave transmitted by each antenna group such that electromagnetic waves transmitted by all antennas of the measured device have aligned amplitudes and phases on the measurement probe, and are coherently superposed, thereby achieving equivalent far-field alignment and superposition of the amplitudes and the phases of the electromagnetic waves transmitted by all the antennas. That is, in this embodiment of the present disclosure, measurement costs can be reduced while an equivalent far-field measurement effect can be achieved within a short distance using a small-sized measurement system, helping deploy the measurement system widely. In addition, in an equivalent far field, electromagnetic waves transmitted by a measured device are coherently superposed at a measurement probe, and amplitudes of the electromagnetic waves are amplified such that a more accurate measurement result can be obtained. It can be learned that the method provided in this embodiment of the present disclosure can achieve a far-field measurement effect in a medium or near field, and obtain a highly accurate measurement result.

First, terms used in the embodiments of the present disclosure are explained and described.

1. Over-the-air beam parameter. An over-the-air beam parameter is a parameter obtained by measuring a received electromagnetic wave beam using a probe or a measurement antenna to receive or transmit a signal in an electromagnetic field space.

2. Coherent superposition. Electromagnetic waves having a same frequency, polarization direction, and propagation direction meet in space. An amplitude of an electromagnetic wave increases or decreases with a change in a phase of an electromagnetic wave signal.

Figure 2:
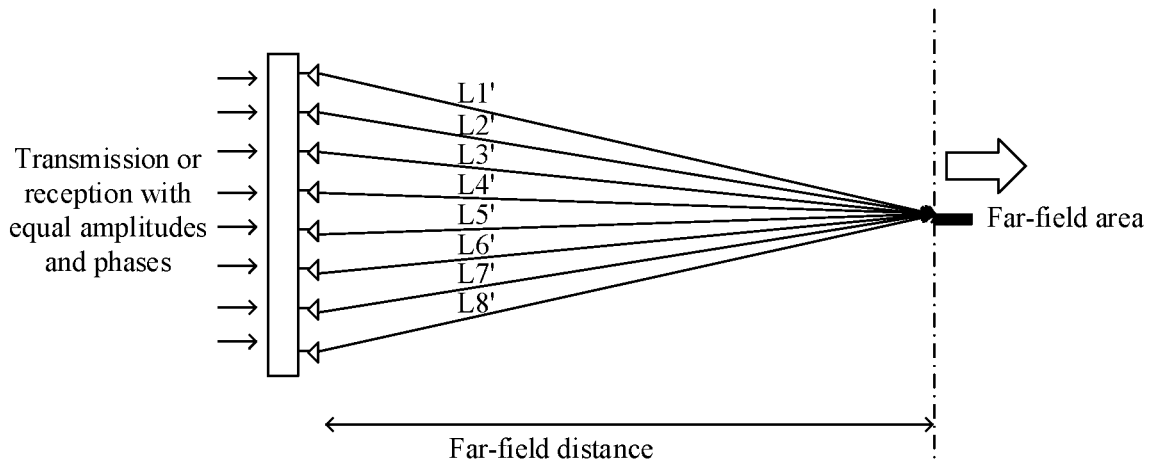
FIG. 2 is a schematic diagram of far-field measurement according to an embodiment of the present disclosure.

3. Far-field measurement. A distance between a measurement probe of a measurement device and an antenna array of a measured device is relatively long. For example, the distance exceeds the far-field boundary distance. Referring to FIG. 2, in a far-field measurement, a measurement distance is relatively long, distances from all antennas of the measured device to the measurement probe differ relatively slightly, and an angle between the measurement probe and an antenna is also relatively small. Further, when the measured device transmits electromagnetic waves in an ideal state in an equal amplitude and an equal phase, phases of electromagnetic waves sent by antennas in a main beam direction are approximately the same, the electromagnetic waves are coherently superposed in space, and amplitudes of the electromagnetic waves are amplified. When the distance reaches the far-field boundary distance, an increase of the measurement distance does not significantly change a phase relationship between the electromagnetic waves transmitted by the antennas. An amplitude of an electromagnetic wave in a far-field area tends to be stable. An over-the-air beam parameter is measured in a far field, and this helps obtain an accurate and stable measurement result.

Figure 3:
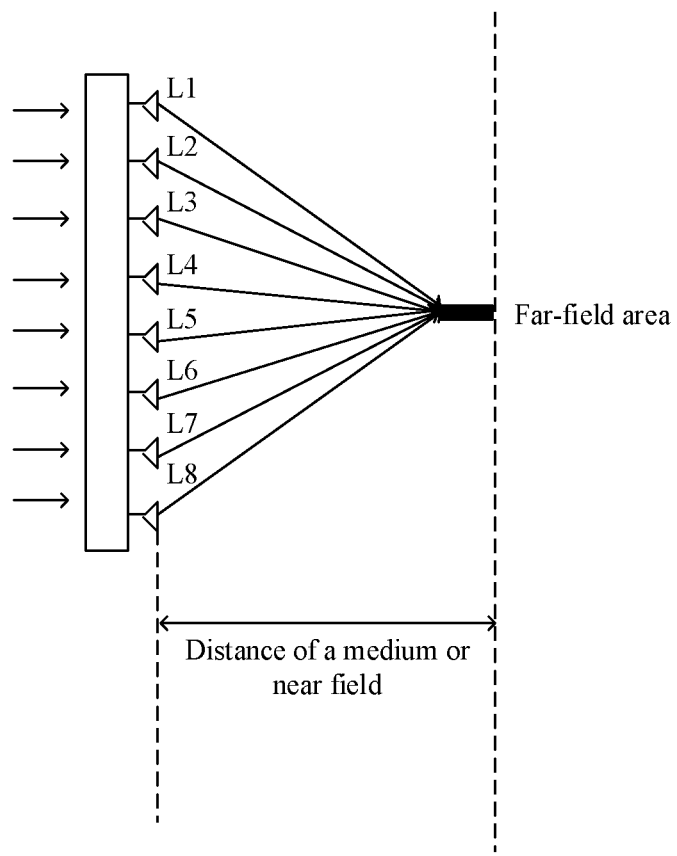
FIG. 3 is a schematic diagram of medium or near field measurement according to an embodiment of the present disclosure.

4. Medium or near field measurement. A distance between the measurement probe of the measurement device and the antenna array of the measured device is relatively short. For example, the distance exceeds the far-field boundary distance. Referring to FIG. 3, in a medium or near field measurement, a measurement distance is relatively short, distances from all antennas of the measured device to the measurement probe differ relatively greatly, and an angle between the measurement probe and an antenna is also relatively large. That is, the measured device transmits electromagnetic waves in an ideal state in an equal amplitude and an equal phase, phases of electromagnetic waves sent by antennas in a main beam direction differ greatly when the electromagnetic waves sent by the antennas arrive at the measurement probe, an amplitude enhancement effect generated by a coherent superposition is far worse than an enhancement effect in the far-field measurement, and even the amplitude of the electromagnetic waves may be reduced. In this way, when an over-the-air beam parameter is measured in a medium or near field, accuracy and stability of a measurement result are relatively poor.

Figure 4:
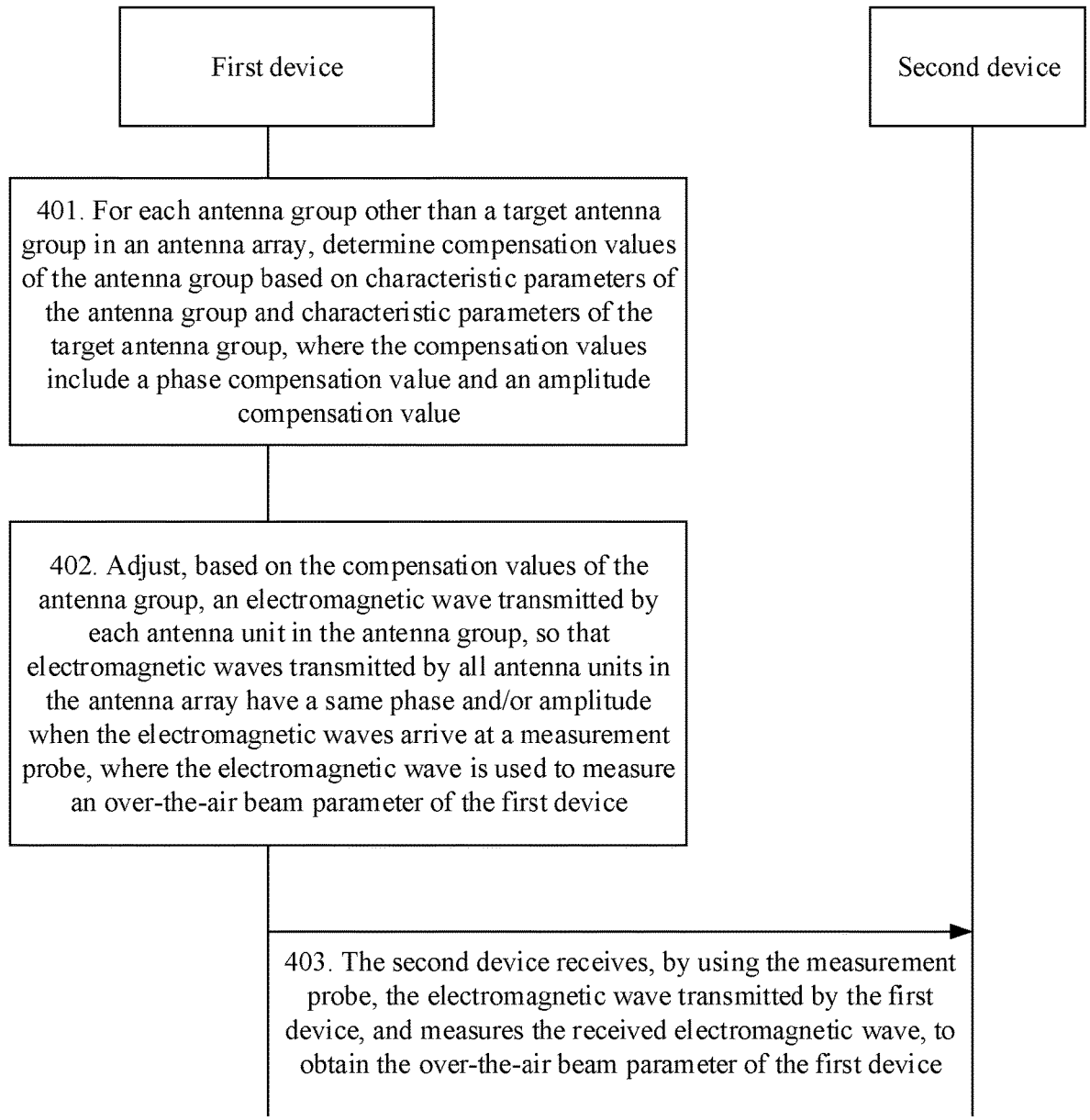
FIG. 4 is a schematic flowchart of a measurement method according to an embodiment of the present disclosure.

An embodiment of the present disclosure provides a measurement method, applied to an over-the-air measurement system. As shown in FIG. 4, the method includes the following steps.

401. For each antenna group other than a target antenna group in the antenna array, determine compensation values of the antenna group based on characteristic parameters of the antenna group and characteristic parameters of the target antenna group, where the compensation values include a phase compensation value and an amplitude compensation value.

The calculation module 103 of the first device may determine the compensation values of each antenna group. The characteristic parameters of the antenna group include a first characteristic parameter and a second characteristic parameter. The first characteristic parameter is used to determine a phase compensation value, and the second characteristic parameter is used to determine an amplitude compensation value. In addition, a distance between the first device and the measurement probe is less than a far-field boundary distance.

In a specific implementation, antennas of the first device are phased array antennas arranged in a matrix form. For example, the antenna array of the first device includes phased array antennas in N rows by M columns, each plurality of antennas in each column constitute one antenna group, and each independent antenna may be one antenna group. In some embodiments, the first characteristic parameter of the antenna group may be a distance between a center of the antenna group and a center of the measurement probe.

It should be noted that the center of the antenna group is a phase center of the antenna group. Usually, the phase center of the antenna group coincides with a geometric center. When the phase center does not coincide with the geometric center, an offset between the phase center and the geometric center may be obtained through measurement or simulation, and then the phase center is obtained through derivation based on the geometric center. During actual deployment of the measurement system, a three-dimensional coordinate system may be created, and the first device and the second device are deployed based on a near field measurement requirement such that three-dimensional coordinates of each antenna unit and three-dimensional coordinates of the measurement probe may be obtained, and coordinates of a geometric center of an antenna group may be determined using coordinates of all antenna units in the antenna group.

Figure 5:
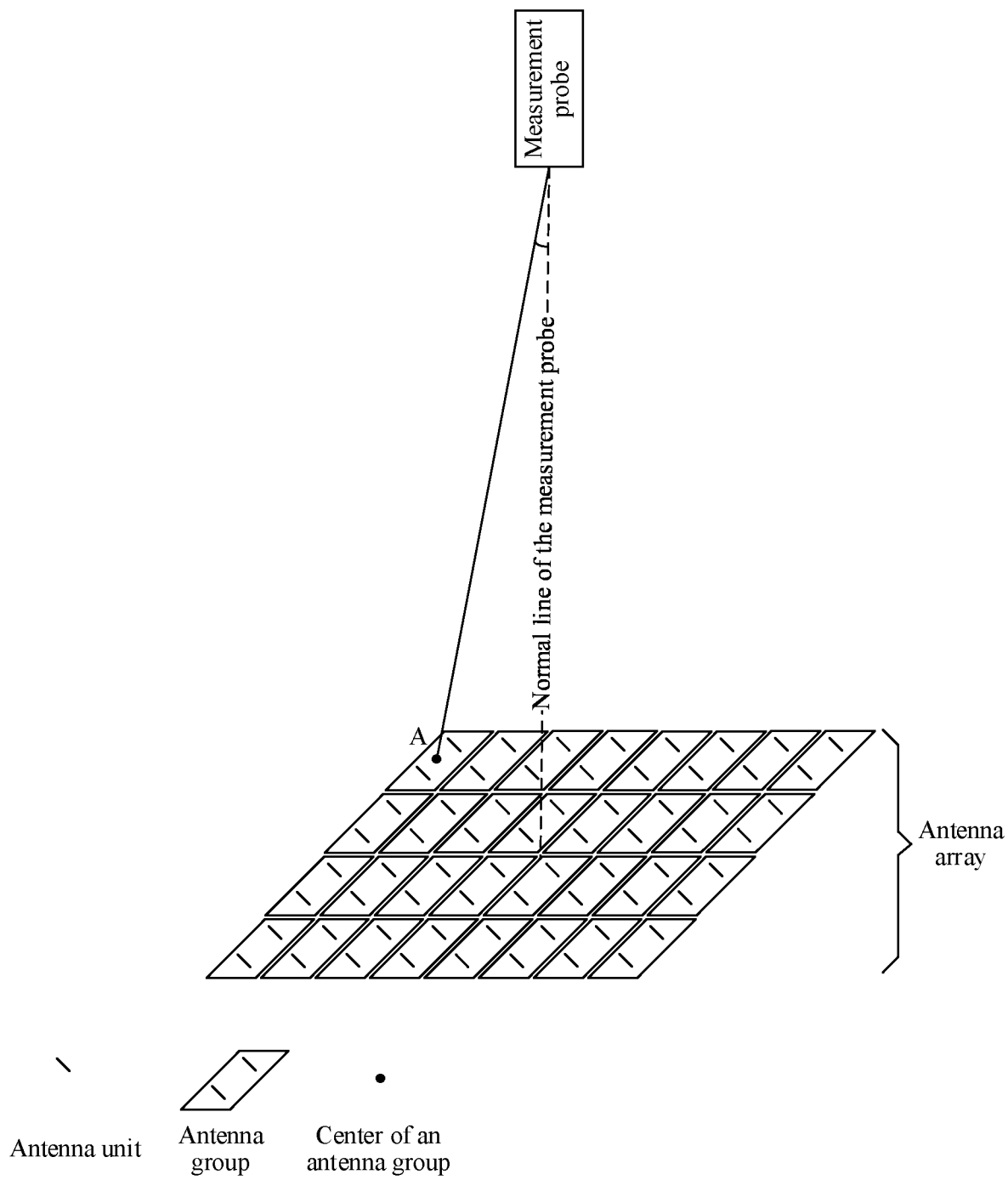
FIG. 5 is a schematic diagram of characteristic parameters of an antenna group according to an embodiment of the present disclosure.

Referring to FIG. 5, every two antennas in a column in the matrix constitute one antenna group, a center of the antenna group is a center point A of a straight line in which the two antennas are located, and a first characteristic parameter of the antenna group may be a distance from the center point A to the center of the measurement probe.

In some embodiments, a second characteristic parameter of the antenna group may be an angle between a normal line P of the measurement probe and a connection line L between the center of the antenna group and the center of the measurement probe. The angle between the normal line P of the measurement probe and the connection line L between the center of the antenna group and the center of the measurement probe may be classified into an azimuth $\alpha$ and a pitch angle $\beta$. In this embodiment of the present disclosure, the azimuth between the normal line P of the measurement probe and the connection line L between the center of the antenna group and the center of the measurement probe is an angle between a projection of the connection line L on a horizontal plane and the normal line P of the measurement probe. The pitch angle between the normal line P of the measurement probe and the line L between the center of the antenna group and the center of the measurement probe is an angle between a projection of the line L on a vertical plane and the normal line P of the measurement probe.

In some embodiments, if the first characteristic parameter of the antenna group is a distance between the center of the antenna group and the center of the measurement probe, that is, the first characteristic parameter of the antenna group indicates a distance between the antenna group and the measurement probe, a phase compensation value of the antenna group may be obtained based on the first characteristic parameter of the antenna group and a first characteristic parameter of a target antenna group. A phase compensation value of each antenna group may be calculated based on a distance from a center of each antenna group to the center of the measurement probe. First, a distance between a center point of each antenna group and a center point of the measurement probe needs to be determined, and an antenna group is selected from all the antenna groups as the target antenna group. For example, an antenna group located at a central location of the antenna array of the first device is used as the target antenna group. Further, a distance difference between the characteristic parameters of each antenna group other than the target antenna group in the antenna groups in the antenna array and the characteristic parameters of the target antenna group is calculated. For example, there are six antenna groups A, B, C, D, E, and F in total, distances between the six antenna groups and the center of the measurement probe are respectively S1, S2, S3, S4, S5, and S6, and the antenna group D is designated as the target antenna group. In this case, distance differences between A, B, C, E, and F and D are respectively |S1-S4|, |S2-S4|, |S3-S4|, |S5-S4|, and |S6-S4|. Then, the phase compensation value of each antenna group may be calculated based on a distance difference corresponding to each antenna group. The phase compensation value $\Delta\phi$ corresponding to the antenna group meets $\Delta\phi=\Delta d/(\lambda*360)$, where $\Delta d$ is the distance difference corresponding to the antenna group, and $\lambda$ is a wavelength of an electromagnetic wave transmitted by the antenna array.

With reference to the foregoing example, the distance differences between A, B, C, E, and F and D are separately substituted into $\Delta\phi=\Delta d/(\lambda*360)$, and phase compensation values of A, B, C, E, and F are calculated to be (S1-S4)/($\lambda*360$), (S2-S4)/($\lambda*360$), (S3-S4)/($\lambda*360$), (S5-S4)/($\lambda*360$), and (S6-S4)/($\lambda*360$), respectively.

In this embodiment of the present disclosure, a wave path difference between antenna groups is calculated using a distance between the target antenna group and the measurement probe as a reference such that a phase adjustment value of each antenna group can be determined, and an electromagnetic wave transmitted by each antenna group is adjusted based on the determined phase adjustment value. In this way, phases of the electromagnetic waves transmitted by the antenna groups are aligned when the electromagnetic waves transmitted by the antenna groups arrive at the measurement probe such that the electromagnetic waves transmitted by the antenna groups are coherently superposed.

In some embodiments, the second characteristic parameter of the antenna group may be an angle between a normal line P of the measurement probe and a connection line L between the center of the antenna group to the center of the measurement probe, for example, an azimuth angle or a pitch angle. In other words, the second characteristic parameter of the antenna group indicates a distance between the antenna group and the measurement probe. The amplitude compensation value of the antenna group may be obtained based on the second characteristic parameter of the antenna group and a second characteristic parameter of the target antenna group. The amplitude compensation value of the antenna group is calculated based on an angle between the normal line P of the measurement probe and the connection line L between the center of the antenna group and the center of the measurement probe. First, an azimuth and a pitch angle between the normal line of the measurement probe and the connection line between the center point of each antenna group and the center point of the measurement probe need to be determined. Further, a gain decrement corresponding to the azimuth of the antenna group and a gain decrement corresponding to the pitch angle of the antenna group may be obtained by comparing directivity patterns of the antenna group. A sum of the two gain decrements is a gain decrement $\nabla 1$ of the antenna group. The gain decrement of the antenna group may be considered as a transmit gain loss of an antenna caused by an angle between the measurement probe and a direction of the antenna and a main beam. In addition, a gain decrement corresponding to the azimuth of the measurement probe and a gain decrement corresponding to the pitch angle of the measurement probe are obtained by comparing directivity patterns of the measurement probe. A sum of the two gain decrements is a gain decrement $\nabla 2$ of the measurement probe. The gain decrement of the measurement probe may be considered as a receive gain loss of the measurement probe caused by an angle between the measurement probe and a direction of an antenna and a main beam. A sum of the gain decrement $\nabla 1$ of the antenna group and the gain decrement $\nabla 2$ of the measurement probe is used as the amplitude compensation value of the antenna group. It should be noted that the directivity pattern of the antenna group records a correspondence between an angle of an antenna and a transmit gain loss, and the transmit gain loss may be determined by comparing a determined angle of the antenna with the directivity pattern of the antenna group. The directivity pattern of the measurement probe records a correspondence between an angle of an antenna and a receive gain loss, and the receive gain loss may be determined by comparing a determined angle of the antenna with the directivity pattern of the measurement probe.

In some embodiments, the first device may further first measure an amplitude and a phase of each antenna group and that are obtained when an electromagnetic wave transmitted by the antenna group arrives at the measurement probe, and then may obtain a phase compensation value and an amplitude compensation value of each antenna group based on a measurement result. In this implementation, the first characteristic parameter of the antenna group is a phase, of an electromagnetic wave transmitted by the antenna group, that exists when the electromagnetic wave transmitted by the antenna group arrives at the measurement probe, and the second characteristic parameter of the antenna group is an amplitude, of the electromagnetic wave transmitted by the antenna group, that exists when the electromagnetic wave transmitted by the antenna group arrives at the measurement probe. Similarly, a phase compensation value of an antenna group may be obtained based on the first characteristic parameter of the antenna group and the first characteristic parameter of the target antenna group, and an amplitude compensation value of the antenna group may be obtained based on a second characteristic parameter of the antenna group and the second characteristic parameter of the target antenna group. The first device first transmits an electromagnetic wave using each antenna group, and measures an amplitude and a phase of the electromagnetic wave transmitted by each antenna group that are obtained when the electromagnetic wave transmitted by each antenna group arrives at the measurement probe. Further, an antenna group is selected from all antenna groups as the target antenna group. For example, an antenna group located at a central location of the antenna array of the first device is used as the target antenna group. Then, an amplitude difference between each antenna group other than the target antenna group in the antenna groups in the antenna array and the target antenna group is calculated as the amplitude compensation value, and a phase difference between each antenna group other than the target antenna group in the antenna groups of the antenna array and the target antenna group is calculated as the phase compensation value.

For example, there are six antenna groups A, B, C, D, E, and F in total, and the antenna group D is designated as the target antenna group. Phases of the six antenna groups when electromagnetic waves transmitted by the six antenna groups arrive at the measurement probe are respectively $\varphi 1$, $\varphi 2$, $\varphi 3$, $\varphi 4$, $\varphi 5$, and $\varphi 6$, and phase compensation values of A, B, C, E, and F are respectively ($\varphi 1-\varphi 4$), ($\varphi 2-\varphi 4$), ($\varphi 3-\varphi 4$), ($\varphi 5-\varphi 4$), and ($\varphi 6-\varphi 4$). Phases of the six antenna groups when the electromagnetic waves transmitted by the six antenna groups arrive at the measurement probe are respectively A1, A2, A3, A4, A5, and A6, and phase compensation values of A, B, C, E, and F are respectively (A1−A4), (A2−A4), (A3−A4), (A5−A4), and (A6−A4).

It should be noted that, when the angle between the normal line P of the measurement probe and the connection line L between the center of the antenna group and the center of the measurement probe is relatively small, a main lobe of the directivity pattern of each of the measurement probe and the antenna group is relatively wide. Because a gain loss caused by the angle between the normal line P of the measurement probe and the connection line L between the center of the antenna group and the center of the measurement probe is small, the gain loss caused by the angle between the normal line P of the measurement probe and the connection line L between the center of the antenna group and the center of the measurement probe may be ignored. Further, only the phase compensation value of each antenna group may be considered, only a phase of the electromagnetic wave transmitted by the antenna group is adjusted, and an amplitude of the electromagnetic wave transmitted by the antenna group does not need to be adjusted.

402. Adjust, based on the compensation values of the antenna group, an electromagnetic wave transmitted by each antenna unit in the antenna group such that electromagnetic waves transmitted by all antenna units in the antenna array have a same phase and/or amplitude when the electromagnetic waves arrive at the measurement probe, where the electromagnetic wave is used to measure an over-the-air beam parameter of the first device.

In a specific implementation, the first device sends a control signal to the amplitude and phase adjustment module 102 connected to each antenna group, to indicate an amplitude compensation value and/or a phase compensation value corresponding to the antenna group connected to the amplitude and phase adjustment module 102. After receiving the control signal, the amplitude and phase adjustment module 102 may correspondingly adjust, based on an indication of a processor of the first device, an amplitude and a phase of an electromagnetic wave transmitted by the antenna group connected to the amplitude and phase adjustment module 102. The amplitude and phase adjustment module 102 may include a phase shifter, and adjust, using the phase shifter, the phase of the electromagnetic wave transmitted by the antenna group. If the phase compensation value is positive, the phase of the electromagnetic wave transmitted by the antenna group is increased. If the phase compensation value is negative, the phase of the electromagnetic wave transmitted by the antenna group is decreased. The amplitude and phase adjustment module 102 may further include an attenuator, and adjust, using the attenuator, the amplitude of the electromagnetic wave transmitted by the antenna group. If the amplitude compensation value is positive, the amplitude of the electromagnetic wave transmitted by the antenna group is increased. If the amplitude compensation value is negative, the amplitude of the electromagnetic wave transmitted by the antenna group is decreased. Certainly, the amplitude and phase adjustment module 102 may alternatively not include any hardware component, and may adjust, in a digital manner, the amplitude and the phase of the electromagnetic wave transmitted by the antenna group. When the antenna group includes a plurality of antennas, the amplitude and phase adjustment module 102 may separately adjust the electromagnetic wave transmitted by each antenna unit, and then weight electromagnetic waves obtained after the adjustment to obtain the electromagnetic wave of the antenna group.

It should be noted that the first device may not adjust the electromagnetic wave transmitted by the target antenna group, but adjust, based on the amplitude compensation value corresponding to the antenna group, the amplitude of the electromagnetic wave transmitted by the antenna group, and adjust, based on the phase compensation value corresponding to the antenna group, the phase of the electromagnetic wave transmitted by the antenna group. After the amplitudes and the phases of the electromagnetic waves of the antenna groups other than the target antenna group are adjusted, electromagnetic waves transmitted by all antenna groups have aligned phases and/or amplitudes when the electromagnetic waves transmitted by all the antenna groups arrive at the measurement probe, achieving equivalent far-field alignment and superposition of the amplitudes and the phases of the electromagnetic waves transmitted by all the antennas.

In addition, in this embodiment of the present disclosure, adjusting the electromagnetic wave transmitted by the antenna array of the first device may be understood as adjusting an amplitude and a phase of an electrical signal converted from the electromagnetic wave such that electromagnetic waves can have spatially aligned phases and amplitudes, and are coherently superposed.

403. The second device receives, using the measurement probe, the electromagnetic wave transmitted by the first device, and measures the received electromagnetic wave, to obtain the over-the-air beam parameter of the first device.

It should be noted that, in this embodiment of the present disclosure, the over-the-air beam parameter obtained by the second device by measuring the received electromagnetic wave may be at least one of an EIRP, an EVM, an ACLR, a frequency error, and EIS.

In this embodiment of the present disclosure, a distance between the first device and the measurement probe of the second device in the measurement system is less than the far-field boundary distance. The amplitudes and the phases of the electromagnetic waves transmitted by the antenna groups are adjusted such that the electromagnetic waves transmitted by the antenna groups have aligned phases and/or the amplitudes when the electromagnetic waves transmitted by the antenna groups arrive at the measurement probe, and are coherently superposed. An equivalent far-field effect is achieved within a distance of a medium or near field, the amplitude of the electromagnetic wave tends to be stable, and measurement of the over-the-air beam parameter helps obtain an accurate and stable measurement result in medium or near field measurement. It can be learned that in this embodiment of the present disclosure, measurement costs can be reduced while an equivalent far-field measurement effect can be achieved within a short distance using a small-sized measurement system. In addition, a relatively-small-sized measurement system is no longer limited by factors such as an occupied area and occupied space, helping deploy the measurement system widely.

In some embodiments, the first device may further measure an electromagnetic wave transmitted by the second device, to obtain an over-the-air beam parameter of the second device. The first device controls each amplitude and phase adjustment module 102 to adjust, based on compensation values corresponding to an antenna group, an electromagnetic wave received by each antenna unit in the antenna group such that electromagnetic waves received by all the antenna units in the antenna array have a same phase and/or amplitude. The first device sends a control signal to the amplitude and phase adjustment module 102 connected to each antenna group, to indicate an amplitude compensation value and/or a phase compensation value corresponding to the antenna group connected to the amplitude and phase adjustment module 102. After receiving the control signal, the amplitude and phase adjustment module 102 may correspondingly adjust, based on an indication of the first device, an amplitude and a phase of an electromagnetic wave received by the antenna group connected to the amplitude and phase adjustment module 102 such that electromagnetic waves received by the antenna groups have aligned phases and/or amplitudes, and are coherently superposed. Then, received signals of all antenna groups are added to obtain a received signal of the entire antenna array, and the received signal may be used to measure the over-the-air beam parameter of the first device. An equivalent far-field effect is achieved within a distance of a medium or near field, the amplitude of the electromagnetic wave tends to be stable, and measurement of the over-the-air beam parameter helps obtain an accurate and stable measurement result.

It should be noted that, in this embodiment of the present disclosure, adjusting an electromagnetic wave received by the antenna array of the first device may be understood as adjusting an amplitude and a phase of an electrical signal converted from the electromagnetic wave such that electromagnetic waves can have spatially aligned phases and amplitudes, and are coherently superposed.

Further, the first device may measure an electromagnetic wave received by each antenna in the antenna array, to obtain the over-the-air beam parameter of the second device, for example, at least one of an EIRP, an EVM, an ACLR, or EIS.

Figure 6:
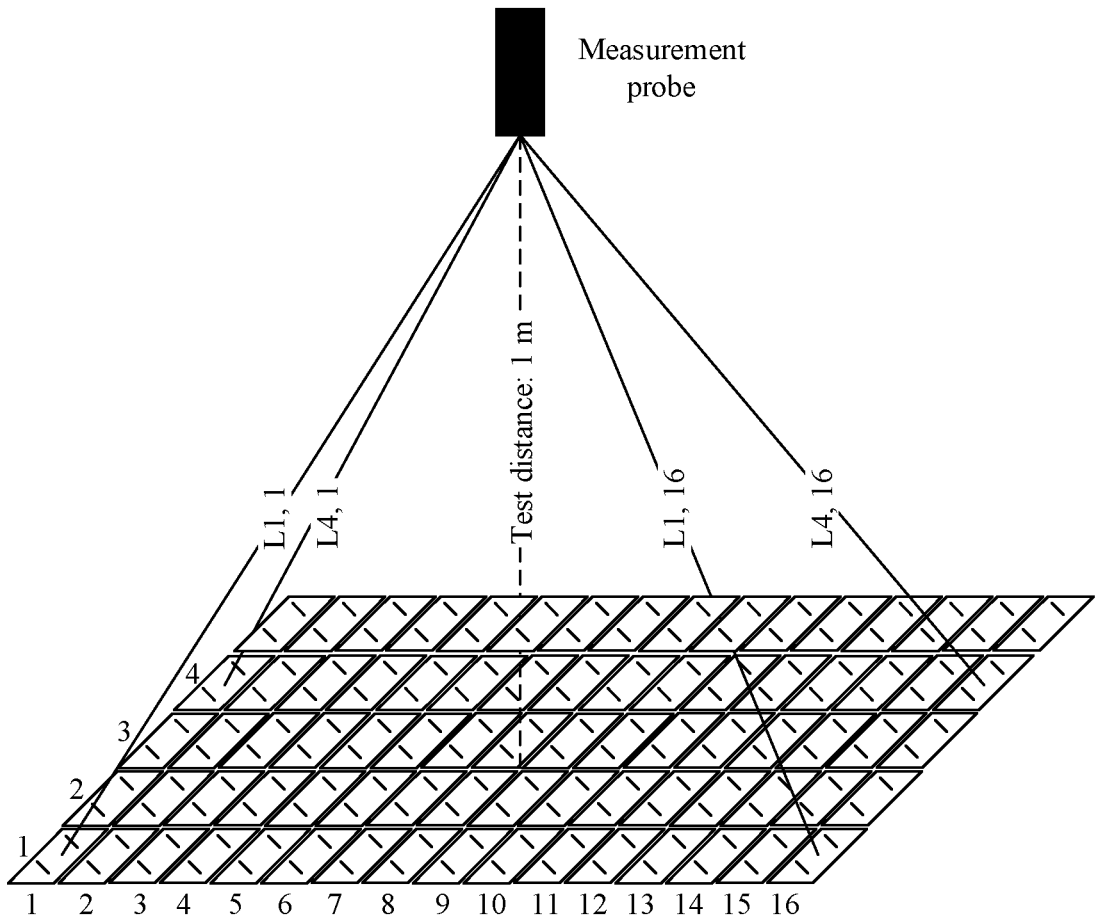
FIG. 6 is a schematic diagram of a measurement system according to an embodiment of the present disclosure.

The following uses a base station including 160 phased array antennas as an example to describe in detail the measurement method provided in this embodiment of the present disclosure. Referring to FIG. 6, the 160 phased array antennas of the base station are arranged in 10 rows by 16 columns, and may transmit an electromagnetic wave or receive an electromagnetic wave. A spacing between every two phased array antennas is 0.6λ, where λ is a wavelength of an electromagnetic wave transmitted at a measurement frequency in a transmission medium. The measurement frequency may be a measured device, for example, the first device or the base station in the embodiments of the present disclosure.

It should be noted that, in this embodiment of the present disclosure, the phase compensation value/amplitude compensation value of each antenna group may be calculated by the first device, and then the phase compensation value/amplitude compensation value is sent to the amplitude and phase adjustment module 102 to adjust the transmitted electromagnetic wave. In some embodiments, the phase compensation value/amplitude compensation value of each antenna group may be alternatively calculated by the second device, and the second device may further transfer the obtained phase compensation value/amplitude compensation value to the first device using the system controller 30. The first device adjusts, based on the received phase compensation value/amplitude compensation value, an electromagnetic wave transmitted by a corresponding antenna group. In some other embodiments, the phase compensation value/amplitude compensation value of each antenna group may be alternatively calculated by the system controller 30, and the system controller 30 transfers the obtained phase compensation value/amplitude compensation value to the first device to adjust an amplitude and a phase of the electromagnetic wave. A device for calculating the phase compensation value/amplitude compensation value is not limited in this embodiment of the present disclosure.

Referring to FIG. 6, in a vertical direction, every two antennas constitute one antenna group, and each antenna group is connected to one amplitude and/or phase adjustment unit 102 such that an amplitude and/or a phase of an electromagnetic wave transmitted by the antenna group can be adjusted.

In the measurement system shown in FIG. 6, the measurement probe is placed one meter in front of the phased array antenna of the base station, and a distance between the measurement probe and the phased array antenna of the base station is less than a far-field boundary distance. This is a medium or near field measurement. The first device calculates compensation values of each antenna group based on the following three steps.

S1. Calculate a distance between a center of each antenna group and the measurement probe based on a geometric relationship.

As shown in FIG. 6, a center of an antenna group may be considered as 0.3λ of a distance between two antennas in the antenna group. $L_{x,y}$ represents a distance from an antenna group in an $x^{th}$ row and a $y^{th}$ column to the measurement probe, that is, a first characteristic parameter of the antenna group in the $x^{th}$ row and the $y^{th}$ column. In addition, when a measurement system is deployed, a location of each antenna and a location of the measurement probe are determined. For example, a three-dimensional coordinate system may be created, coordinates of each antenna and coordinates of the measurement probe may be set, and the entire measurement system may be further deployed based on the specified three-dimensional coordinates. In this embodiment of the present disclosure, three-dimensional coordinates of the center of the antenna group may be calculated based on the three-dimensional coordinates of the two antennas in the antenna group, and a distance between the center of the antenna group and the measurement probe may be further calculated based on the three-dimensional coordinates of the center of the antenna group and the three-dimensional coordinates of the measurement probe.

S2. Calculate a phase compensation value of each antenna group based on the distance $L_{x,y}$ between each antenna group and the measurement probe.

For example, an antenna group in a third row and a sixth column is used as a target antenna group. A calculation formula is as follows $\Delta P_{x,y}=(L_{x,y}-L_{3,6})/(\lambda*360)$, where $\Delta P_{x,y}$ is an additional phase value of a phase compensation value of the antenna group in the $x^{th}$ row and the $y^{th}$ column, and a result is in a unit of degree.

S3. Calculate an azimuth $\varphi_{x,y}$ and a pitch angle $\theta_{x,y}$ between a normal line P of the measurement probe and a connection line L between the center of each antenna group and a center of the measurement probe based on a geometric relationship, and calculate an amplitude compensation value based on the azimuth $\varphi_{x,y}$ and the pitch angle $\theta_{x,y}$.

$\varphi_{x,y}$ represents an azimuth corresponding to the antenna group in the $x^{th}$ row and the $y^{th}$ column, $\theta_{x,y}$ represents a pitch angle corresponding to the antenna group in the $x^{th}$ row and the $y^{th}$ column, and the azimuth $\varphi_{x,y}$ and the pitch angle $\theta_{x,y}$ are second characteristic parameters of the antenna group in the $x^{th}$ row and the $y^{th}$ column. Directivity patterns of the antenna group are compared based on $\varphi_{x,y}$, to determine that a gain of the antenna group in the $x^{th}$ row and the $y^{th}$ column in this direction decreases by $\Delta Gant_{x,y}$. Directivity patterns of the measurement probe are compared based on $\theta_{x,y}$, to determine that a gain decrease amount of the measurement probe is $\Delta Gprobe_{x,y}$. The amplitude compensation value of the antenna group in the $x^{th}$ row and the $y^{th}$ column is $(\Delta Gant_{x,y}+\Delta Gprobe_{x,y})$. Certainly, if $\varphi_{x,y}$ and $\theta_{x,y}$ are relatively small, correspondingly, a gain decrement of the antenna group is very small, and a gain decrement of the measurement probe is very small. In this case, impact of an angle between the normal line P of the measurement probe and the connection line L between the center of the antenna group and the center of the measurement probe on a measurement result may be ignored, and the amplitude of the electromagnetic wave transmitted by the antenna group is not adjusted.

In a specific implementation, the base station first sets an amplitude and a phase of each antenna group to a rated amplitude value and a rated phase value of a normal transmit beam, and the antenna groups perform transmission with equal amplitudes and phases. Further, an electromagnetic wave transmitted by the antenna group in the $x^{th}$ row and the $y^{th}$ column is adjusted using an amplitude and phase adjustment module, to advance a phase of the electromagnetic wave transmitted by the antenna group in the $x^{th}$ row and the $y^{th}$ column by $\Delta P_{x,y}$, and increase an amplitude of the electromagnetic wave transmitted by the antenna group in the $x^{th}$ row and the $y^{th}$ column by $(\Delta Gant_{x,y}+\Delta Gprobe_{x,y})$.

Then, the measurement probe of the measurement device receives an electromagnetic wave transmitted by the base station, and a meter of the measurement device collects a signal received by the measurement probe to perform an over-the-air beam measurement.

For the measurement system shown in FIG. 6, only a measurement of an over-the-air beam parameter of the normal transmit beam is mentioned. When a measurement is performed in another direction based on beam scanning, a location of the measurement probe needs to be changed. Steps and a method for the measurement are deduced based on the foregoing embodiment.

Figure 7:
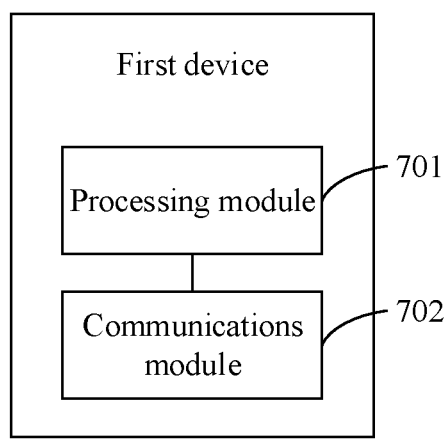
FIG. 7 is a structural block diagram of a first device according to an embodiment of the present disclosure.

When function modules are obtained through division based on corresponding functions, FIG. 7 is a possible schematic structural diagram of the first device in the foregoing embodiments. The first device belongs to an over-the-air measurement system, the over-the-air measurement system further includes a second device, the first device includes an antenna array, the antenna array includes at least one antenna group, the second device includes a measurement probe, and a distance between the first device and the measurement probe is less than a far-field boundary distance. As shown in FIG. 7, the first device includes a processing module 701 and a communications module 702. The processing module 701 may include at least one amplitude and phase adjustment module 102 and a calculation module 103.

The processing module 701 is configured to support the terminal device in performing step 401 and step 402 in the foregoing embodiment and/or is configured to perform another process in the technologies described in this specification.

It should be noted that all related content of the steps in the foregoing method embodiment can be cited in function description of the corresponding function modules. Details are not described herein again.

Figure 8:
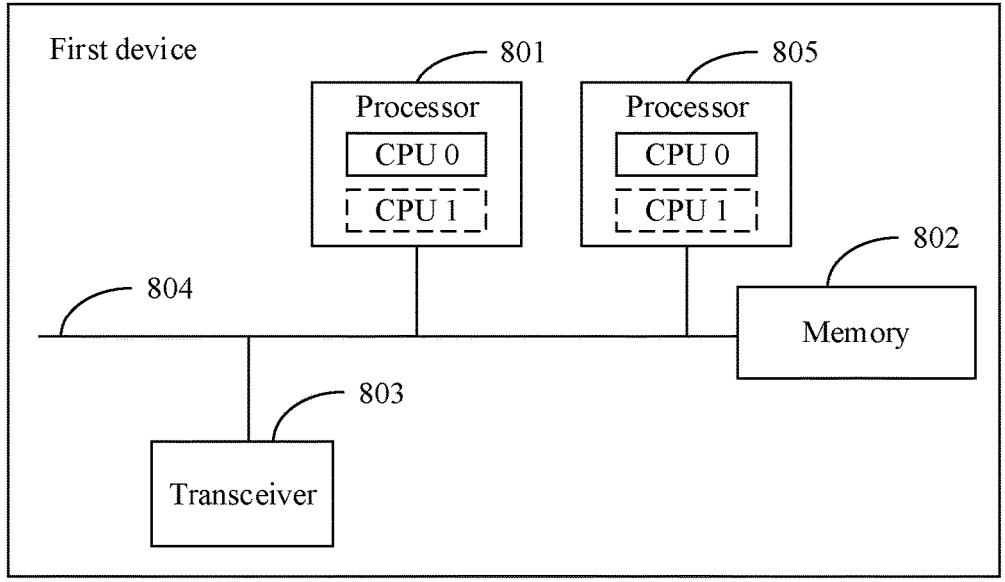
FIG. 8 is another structural block diagram of a first device according to an embodiment of the present disclosure.

The measurement method provided in the embodiments of the present disclosure may be applied to a first device shown in FIG. 8. As shown in FIG. 8, the first device may include at least one processor 801, a memory 802, a transceiver 803, and a communications bus 804.

The following describes components of the first device in detail with reference to FIG. 8.

The processor 801 is a control center of the first device, and may be one processor or may be a collective term of a plurality of processing elements. For example, the processor 801 may be a central processing unit (CPU), or an application-specific integrated circuit (ASIC), or may be configured as one or more integrated circuits implementing the embodiments of the present disclosure, for example, one or more microprocessors, digital signal processors (DSP) or one or more field-programmable gate arrays (FPGA).

The processor 801 may execute various functions of the first device by running or executing a software program stored in the memory 802 and invoking data stored in the memory 802.

During specific implementation, in an embodiment, the processor 801 may include one or more CPUs, for example, a CPU 0 and a CPU 1 in FIG. 8.

During specific implementation, in an embodiment, the first device may include a plurality of processors such as the processor 801 and a processor 805 in FIG. 8. Each of the processors may be a single-core (single-CPU) processor or may be a multi-core (multi-CPU) processor. The processor herein may be one or more first devices, circuits, and/or processing cores for processing data (for example, a computer program instruction).

The memory 802 may be a read-only memory (ROM) or another type of static storage device that can store static information and an instruction, or a random-access memory (RAM) or another type of dynamic storage device that can store information and an instruction, or may be an electrically erasable programmable ROM (EEPROM), a compact disc ROM (CD-ROM) or another compact disc storage medium, optical disc storage medium (including a compact disc, a laser disc, an optical disc, a digital versatile disc, a BLU-RAY disc, or the like), a magnetic disk storage medium, another magnetic storage device, or any other medium that can be used to carry or store expected program code in a form of an instruction or a data structure and that can be accessed by a computer. This is not limited. The memory 802 may exist independently, and is connected to the processor 801 through the communications bus 804. The memory 802 may alternatively be integrated with the processor 801.

The memory 802 is configured to store the software program for executing the solution in the present disclosure, and the processor 801 controls the execution.

The transceiver 803 is configured to communicate with a second device. The transceiver 803 may be an antenna array of the first device. Certainly, the transceiver 803 may be further configured to communicate with a communications network, for example, an Ethernet, a wireless access network (WAN), or a wireless local area network (WLAN). The transceiver 803 may include a receiving unit for implementing a receiving function and a sending unit for implementing a sending function.

The communications bus 804 may be an Industry Standard Architecture (ISA) bus, a Peripheral Component Interconnect (PCI) bus, an Extended ISA (EISA) bus, or the like. The bus may be classified into an address bus, a data bus, a control bus, and the like. For ease of representation, only one thick line is used to represent the bus in FIG. 8, but this does not mean that there is only one bus or only one type of bus.

A structure of the first device shown in FIG. 8 does not constitute a limitation on the first device. The first device may include components more or fewer than those shown in the figure, or some components may be combined, or different component configurations may be used.

In the first device shown in FIG. 8, the transceiver 803 may be an antenna array. The processor 801 may adjust, in a digital manner, an amplitude and a phase of an electromagnetic wave transmitted by the antenna array of the first device.

Figure 9:
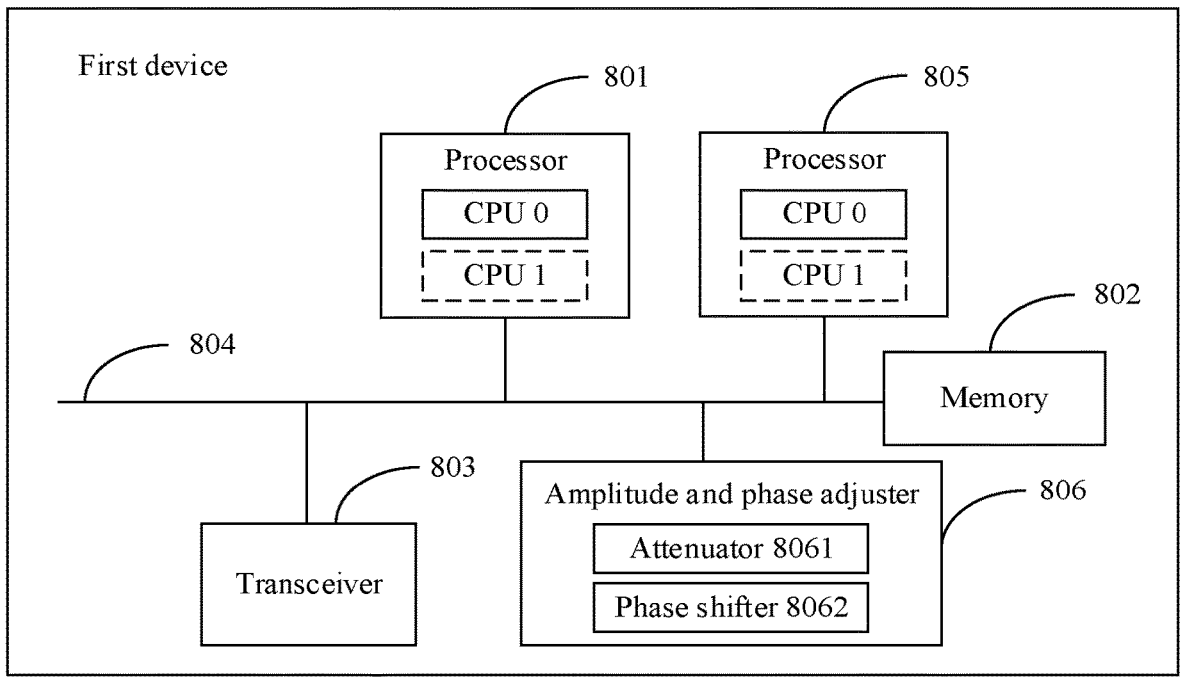
FIG. 9 is another structural block diagram of a first device according to an embodiment of the present disclosure.

Certainly, based on the structure shown in FIG. 8, referring to FIG. 9, the first device may further include an amplitude and phase adjuster 806. The amplitude and phase adjuster 806 may include an attenuator 8061 and a phase shifter 8062. The attenuator 8061 may adjust an amplitude of an electromagnetic wave transmitted by the antenna array of the first device, and the phase shifter 8062 may adjust a phase of an electromagnetic wave transmitted by the antenna array of the first device.

According to the foregoing descriptions of the implementations, a person skilled in the art may clearly understand that, for the purpose of convenient and brief description, only division into the foregoing function modules is used as an example for description. In an embodiment, the foregoing functions may be allocated to different function modules and implemented based on a requirement. In other words, an inner structure of a first device is divided into different function modules, to implement all or some of the functions described above.

In the several embodiments provided in this application, it should be understood that the disclosed first device and method may be implemented in other manners. For example, the described first device embodiment is merely an example. For example, division into the modules or units is merely logical function division and may be other division in an embodiment. For example, a plurality of units or components may be combined or integrated into another apparatus, or some features may be ignored or not performed. In addition, the displayed or discussed mutual couplings or direct couplings or communication connections may be implemented through some interfaces. The indirect couplings or communication connections between the first device or units may be implemented in electronic, mechanical, or other forms.

The units described as separate parts may or may not be physically separate, and parts displayed as units may be one or more physical units, may be located in one place, or may be distributed in different places. Some or all of the units may be selected based on actual requirements to achieve the objectives of the solutions of the embodiments.

In addition, function units in the embodiments of this application may be integrated into one processing unit, or each of the units may exist alone physically, or two or more units are integrated into one unit. The integrated unit may be implemented in the form of hardware, or may be implemented in the form of a software function unit.

When the integrated unit is implemented in the form of a software function unit and sold or used as an independent product, the integrated unit may be stored in a readable storage medium. Based on such an understanding, the technical solutions of this application essentially, or the part contributing to other approaches, or all or some of the technical solutions may be implemented in the form of a software product. The software product is stored in a storage medium and includes several instructions for instructing a device (which may be a single-chip microcomputer, a chip, or the like) or a processor to perform all or some of the steps of the methods described in the embodiments of this application. The foregoing storage medium includes any medium that can store program code, such as a Universal Serial Bus (USB) flash drive, a removable hard disk, a ROM, a RAM, a magnetic disk, or an optical disc.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A measurement method implemented by an over-the-air measurement system, and comprising:

determining, for each antenna group other than a target antenna group in an antenna array, a plurality of compensation values of the antenna group based on a first set of characteristic parameters of the antenna group and a second set of characteristic parameters of the target antenna group, wherein the first set comprises a first characteristic parameter for determining a first phase compensation value and a second characteristic parameter for determining a first amplitude compensation value, wherein the second set comprises a third characteristic parameter for determining a second phase compensation value and a fourth characteristic parameter for determining a second amplitude compensation value, wherein the compensation values comprise a third phase compensation value and a third amplitude compensation value;

using an azimuth and a pitch angle between a normal line of a measurement probe of an over-the-air measurement system and a connection line between a first center point of the antenna group and a second center point of the measurement probe as the second characteristic parameter;

obtaining a first gain decrement of the antenna group based on an azimuth corresponding to the antenna group;

obtaining a second gain decrement of the measurement probe based on the pitch angle;

using a sum of the first gain decrement and the second gain decrement as the first amplitude compensation value; and adjusting a first electromagnetic wave from each antenna unit in the antenna group based on the compensation values, wherein the first electromagnetic wave has a same phase or a same amplitude as a plurality of electromagnetic waves from all antenna units in the antenna array when the first electromagnetic wave arrives at the measurement probe, and wherein the first electromagnetic wave is for measuring an over-the-air beam parameter of a first device of the over-the-air measurement system.

2. The measurement method of claim 1, further comprising:

using a distance from the first center point of the antenna group to the measurement probe as the first characteristic parameter of the antenna group;

calculating a distance difference between the first characteristic parameter and the third characteristic parameter; and calculating the first phase compensation value of the antenna group based on the distance difference.

3. The measurement method of claim 2, wherein the first phase compensation value, the second phase compensation value, and the third phase compensation value are $\Delta\phi$ and are according to the following equation:

$$\Delta\phi = \Delta d/(\lambda * 360),$$

wherein Δd is the distance difference, and wherein λ is a wavelength of a second electromagnetic wave from the antenna array.

4. The measurement method of claim 1, further comprising:
   transmitting a third electromagnetic wave using the antenna group and the target antenna group;
   obtaining an amplitude and a phase of the third electromagnetic wave in response to the third electromagnetic wave arriving at the measurement probe;
   calculating a phase difference between a first phase of the third electromagnetic wave from the antenna group in response to the third electromagnetic wave from the antenna group arriving at the measurement probe and a second phase of the third electromagnetic wave from the target antenna group in response to the third electromagnetic wave from the target antenna group arriving at the measurement probe;
   using the phase difference as the first phase compensation value, wherein the first phase is the first characteristic parameter, and wherein the second phase is the third characteristic parameter;
   calculating an amplitude difference between a first amplitude of the third electromagnetic wave from the antenna group in response to the third electromagnetic wave from the antenna group arriving at the measurement probe and a second amplitude of the third electromagnetic wave from the target antenna group in response to the third electromagnetic wave from the target antenna group arriving at the measurement probe; and
   using the amplitude difference as the first amplitude compensation value, wherein the first amplitude is the second characteristic parameter, and wherein the second amplitude is the fourth characteristic parameter.

5. The measurement method of claim 1, further comprising:
   receiving, by each antenna unit in the antenna group, a plurality of electromagnetic waves;
   receiving, by each antenna unit in the antenna group, a plurality of signals;
   adjusting the electromagnetic waves based on the compensation values of the antenna group such that the electromagnetic waves have the same phase; and
   measuring the over-the-air beam parameter of the first device based on the signals.

6. The measurement method of claim 1, further comprising:
   receiving, by each antenna unit in the antenna group, a plurality of electromagnetic waves;
   receiving, by each antenna unit in the antenna group, a plurality of signals;
   adjusting the electromagnetic waves based on the compensation values of the antenna group such that the electromagnetic waves have the same amplitude; and
   measuring the over-the-air beam parameter of the first device based on the signals.

7. The measurement method of claim 1, wherein the over-the-air beam parameter comprises at least one of an effective isotropically radiated power (EIRP), an error vector magnitude (EVM), an adjacent channel leakage ratio (ACLR), a frequency error, or effective isotropic sensitivity (EIS).

8. A device in an over-the-air measurement system, wherein the device comprises:
   a transceiver;
   a processor coupled to the transceiver; and
   a memory coupled to the processor and configured to store instructions that, when executed by the processor, cause the device to be configured to:
      determine, for each antenna group other than a target antenna group in an antenna array, a plurality of compensation values of the antenna group based on a first set of characteristic parameters of the antenna group and a second set of characteristic parameters of the target antenna group, wherein the first set comprises a first characteristic parameter for determining a first phase compensation value and a second characteristic parameter for determining a first amplitude compensation value, wherein the second set comprises a third characteristic parameter for determining a second phase compensation value and a fourth characteristic parameter for determining a second amplitude compensation value, wherein the compensation values comprise a third phase compensation value and a third amplitude compensation value;
      use an azimuth and a pitch angle between a normal line of a measurement probe of an over-the-air measurement system and a connection line between a first center point of the antenna group and a second center point of the measurement probe as the second characteristic parameter;
      obtain a first gain decrement of the antenna group based on an azimuth corresponding to the antenna group;
      obtain a second gain decrement of the measurement probe based on the pitch angle;
      use a sum of the first gain decrement and the second gain decrement as the first amplitude compensation value; and
      adjust a first electromagnetic wave from each antenna unit in the antenna group based on the compensation values of the antenna group,
   wherein the first electromagnetic wave has a same phase or a same amplitude as a plurality of electromagnetic waves from all antenna units in the antenna array when the first electromagnetic wave arrives at the measurement probe, wherein the first electromagnetic wave is used to measure an over-the-air beam parameter of the device.

9. The device of claim 8, wherein the instructions further cause the device to be configured to:
   use a distance from the first center point of the antenna group to the measurement probe as the first characteristic parameter;
   calculate a distance difference between the first characteristic parameter and the third characteristic parameter; and
   calculate the first phase compensation value based on the distance difference.

10. The device of claim 9, wherein the first phase compensation value, the second phase compensation value, and the third phase compensation value are Δφ and are according to the following equation Δφ=Δd/(λ*360), wherein Δd is the distance difference, and wherein λ is a wavelength of a second electromagnetic wave from the antenna array.

11. The device of claim 8, wherein the instructions further cause the device to be configured to:
   obtain an amplitude and a phase of a third electromagnetic wave from the antenna group and the target antenna group in response to the third electromagnetic wave arriving at the measurement probe;
   calculate a phase difference between a first phase of the third electromagnetic wave from the antenna group in response to the third electromagnetic wave from the antenna group arriving at the measurement probe and a second phase of the third electromagnetic wave from the target antenna group in response to the third electromagnetic wave from the target antenna group arriving at the measurement probe;

use the phase difference as the first phase compensation value, wherein the first phase is the first characteristic parameter, and wherein the second phase is the third characteristic parameter;

calculate an amplitude difference between a first amplitude of the third electromagnetic wave from the antenna group in response to the third electromagnetic wave from the antenna group arriving at the measurement probe and a second amplitude of the third electromagnetic wave from the target antenna group in response to the third electromagnetic wave from the target antenna group arriving at the measurement probe; and use the amplitude difference as the first amplitude compensation value, wherein the first amplitude is the second characteristic parameter, and wherein the second amplitude is the fourth characteristic parameter.

12. The device of claim 8, wherein the instructions further cause the device to be configured to:
receive a plurality of electromagnetic waves;
receive a plurality of signals;
adjust the electromagnetic waves based on the compensation values of the antenna group such that the electromagnetic waves have the same phase; and
measure the over-the-air beam parameter of the device based on the signals.

13. The device of claim 8, wherein the instructions further cause the device to be configured to:
receive a plurality of electromagnetic waves;
receive a plurality of signals;
adjust the electromagnetic waves based on the compensation values of the antenna group such that the electromagnetic waves have the same amplitude; and
measure the over-the-air beam parameter of the device based on the signals.

14. The device of claim 8, wherein the over-the-air beam parameter comprises at least one selected from the group of an effective isotropically radiated power (EIRP), an error vector magnitude (EVM), an adjacent channel leakage ratio (ACLR), a frequency error, and effective isotropic sensitivity (EIS).

15. A computer program product comprising computer-executable instructions for storage on a non-transitory computer-readable medium that, when executed by a processor, cause a device to:
determine, for each antenna group other than a target antenna group in an antenna array, a plurality of compensation values of the antenna group based on a first set of characteristic parameters of the antenna group and a second set of characteristic parameters of the target antenna group, wherein the first set comprises a first characteristic parameter to determine a first phase compensation value and a second characteristic parameter to determine a first amplitude compensation value, wherein the second set comprises a third characteristic parameter to determine a second phase compensation value and a fourth characteristic parameter to determine a second amplitude compensation value, wherein the compensation values comprise a third phase compensation value and a third amplitude compensation value;

use an azimuth and a pitch angle between a normal line of a measurement probe of an over-the-air measurement system and a connection line between a first center point of the antenna group and a second center point of the measurement probe as the second characteristic parameter;

obtain a first gain decrement of the antenna group based on an azimuth corresponding to the antenna group;

obtain a second gain decrement of the measurement probe based on the pitch angle;

use a sum of the first gain decrement and the second gain decrement as the first amplitude compensation value; and adjust a first electromagnetic wave from each antenna unit in the antenna group based on the compensation values of the antenna group, wherein the first electromagnetic wave has a same phase or a same amplitude as a plurality of electromagnetic waves from all antenna units in the antenna array when the first electromagnetic wave arrives at the measurement probe, wherein the first electromagnetic wave is used to measure an over-the-air beam parameter of the device.

16. The computer program product of claim 15, wherein the instructions further cause the device to be configured to:
use a distance from the first center point of the antenna group to the measurement probe as the first characteristic parameter;
calculate a distance difference between the first characteristic parameter and the third characteristic parameter; and
calculate the first phase compensation value based on the distance difference.

17. The computer program product of claim 16, wherein the first phase compensation value, the second phase compensation value, and the third phase compensation value are $\Delta\phi$ and are according to the following equation $\Delta\phi=\Delta d/(\lambda*360)$, wherein $\Delta d$ is the distance difference, and wherein $\lambda$ is a wavelength of a second electromagnetic wave from the antenna array.

18. The computer program product of claim 15, wherein the instructions further cause the device to be configured to:
obtain an amplitude and a phase of a third electromagnetic wave from the antenna group and the target antenna group in response to the third electromagnetic wave arriving at the measurement probe;
calculate a phase difference between a first phase of the third electromagnetic wave from the antenna group in response to the third electromagnetic wave from the antenna group arriving at the measurement probe and a second phase of the third electromagnetic wave from the target antenna group in response to the third electromagnetic wave from the target antenna group arriving at the measurement probe;
use the phase difference as the first phase compensation value, wherein the first phase is the first characteristic parameter, and wherein the second phase is the third characteristic parameter;
calculate an amplitude difference between a first amplitude of the third electromagnetic wave from the antenna group in response to the third electromagnetic wave from the antenna group arriving at the measurement probe and a second amplitude of the third electromagnetic wave from the target antenna group in response to the third electromagnetic wave from the target antenna group arriving at the measurement probe; and use the amplitude difference as the first amplitude compensation value, wherein the first amplitude is the second characteristic parameter, and wherein the second amplitude is the fourth characteristic parameter.

19. The computer program product of claim 15, wherein the instructions further cause the device to be configured to:
- receive a plurality of electromagnetic waves;
- receive a plurality of signals;
- adjust the electromagnetic waves based on the compensation values of the antenna group such that the electromagnetic waves have the same phase; and
- measure the over-the-air beam parameter of the device based on the signals.

20. The computer program product of claim 15, wherein the over-the-air beam parameter comprises at least one selected from the group of an effective isotropically radiated power (EIRP), an error vector magnitude (EVM), an adjacent channel leakage ratio (ACLR), a frequency error, and effective isotropic sensitivity (EIS).

* * * * *

UNITED STATES PATENT AND TRADEMARK OFFICE
CERTIFICATE OF CORRECTION

| | |
|---|---|
| PATENT NO. | : 11,933,828 B2 |
| APPLICATION NO. | : 17/118221 |
| DATED | : March 19, 2024 |
| INVENTOR(S) | : Yi Tang, Zhiwei Zhang and Feng Li |

It is certified that error appears in the above-identified patent and that said Letters Patent is hereby corrected as shown below:

On the Title Page

Page 2, FOREIGN PATENT DOCUMENTS: IN 106788791 A 5/2017 should read CN 106788791 A 5/2017

Signed and Sealed this
Thirtieth Day of April, 2024

Katherine Kelly Vidal
*Director of the United States Patent and Trademark Office*